(12) United States Patent
Lozano et al.

(10) Patent No.: US 10,125,052 B2
(45) Date of Patent: Nov. 13, 2018

(54) METHOD OF FABRICATING ELECTRICALLY CONDUCTIVE AEROGELS

(71) Applicant: Massachusetts Institute of Technology, Cambridge, MA (US)

(72) Inventors: Paulo C. Lozano, Arlington, MA (US); Steven Mark Arestie, Redondo Beach, CA (US)

(73) Assignee: Massachusetts Institute of Technology, Cambridge, MA (US)

( * ) Notice: Subject to any disclaimer, the term of this patent is extended or adjusted under 35 U.S.C. 154(b) by 276 days.

(21) Appl. No.: 14/661,855

(22) Filed: Mar. 18, 2015

(65) Prior Publication Data

US 2016/0376150 A1   Dec. 29, 2016

Related U.S. Application Data

(60) Provisional application No. 61/986,645, filed on Apr. 30, 2014.

(51) Int. Cl.
| | | |
|---|---|---|
| *C04B 35/528* | (2006.01) | |
| *B29C 39/02* | (2006.01) | |
| *B29C 71/02* | (2006.01) | |
| *C04B 35/64* | (2006.01) | |
| *C01B 32/05* | (2017.01) | |
| *F03H 1/00* | (2006.01) | |
| *H01J 37/08* | (2006.01) | |
| *H01J 1/05* | (2006.01) | |
| *H01J 9/02* | (2006.01) | |

(52) U.S. Cl.
CPC ............ *C04B 35/528* (2013.01); *B29C 39/02* (2013.01); *B29C 71/02* (2013.01); *C01B 32/05* (2017.08); *C04B 35/64* (2013.01); *C01P 2006/40* (2013.01); *F03H 1/0006* (2013.01); *H01J 1/05* (2013.01); *H01J 9/02* (2013.01); *H01J 37/08* (2013.01)

(58) Field of Classification Search
None
See application file for complete search history.

(56) References Cited

U.S. PATENT DOCUMENTS

| | | | |
|---|---|---|---|
| 3,486,302 | A | 12/1969 | Paynter |
| 4,855,604 | A | 8/1989 | Riahi |
| 5,018,634 | A | 5/1991 | Le Touche |

(Continued)

FOREIGN PATENT DOCUMENTS

| | | |
|---|---|---|
| WO | WO 2002/055990 A2 | 7/2002 |
| WO | WO 2006/009854 A2 | 1/2006 |

(Continued)

OTHER PUBLICATIONS

Hemberger, Frank, et al. "Thermal transport properties of functionally graded carbon aerogels." International Journal of Thermophysics 30.4 (2009): 1357-1371. (Year: 2009).*

(Continued)

*Primary Examiner* — Benjamin A Schiffman
(74) *Attorney, Agent, or Firm* — Wolf, Greenfield & Sacks, P.C.

(57) ABSTRACT

Electrically conductive aerogel and methods of making the same are disclosed. A solution is provided. The solution is cured to form a polymer. The polymer is carbonized to form the conductive aerogel.

23 Claims, 11 Drawing Sheets

(56) References Cited

U.S. PATENT DOCUMENTS

| | | | |
|---|---|---|---|
| 5,279,323 A | 1/1994 | Grove et al. | |
| 5,624,875 A | 4/1997 | Nakanishi et al. | |
| 6,068,882 A | 5/2000 | Ryu | |
| 6,288,390 B1 | 9/2001 | Siuzdak et al. | |
| 6,297,499 B1 | 10/2001 | Fenn | |
| 6,707,035 B2 | 3/2004 | Hughey et al. | |
| 6,768,119 B2 | 7/2004 | de la Mora et al. | |
| 6,867,415 B2 | 3/2005 | Hughey et al. | |
| 7,015,046 B2 | 3/2006 | Wohlstadter et al. | |
| 7,097,781 B2 | 8/2006 | Asakawa et al. | |
| 7,129,513 B2 | 10/2006 | Zhou et al. | |
| 7,199,364 B2 | 4/2007 | Thakur | |
| 7,335,897 B2 | 2/2008 | Takats et al. | |
| 7,397,032 B2 | 7/2008 | Zona et al. | |
| 7,517,479 B2 | 4/2009 | Bango et al. | |
| 7,696,489 B2 | 4/2010 | Pilz et al. | |
| 7,863,581 B2 | 1/2011 | Lozano et al. | |
| 7,932,492 B2 | 4/2011 | Dammons et al. | |
| 8,030,621 B2 | 10/2011 | Lozano et al. | |
| 8,080,930 B2 | 12/2011 | King | |
| 8,084,735 B2 | 12/2011 | Kertesz et al. | |
| 8,198,106 B2 | 6/2012 | Akinwande et al. | |
| 8,207,496 B2 | 6/2012 | Makarov et al. | |
| 8,227,765 B2 | 7/2012 | Syms | |
| 8,272,345 B2 | 9/2012 | Robertson et al. | |
| 8,324,593 B2 | 12/2012 | Lozano et al. | |
| 8,368,295 B2 | 2/2013 | Wei et al. | |
| 8,394,877 B2 | 3/2013 | Asakawa et al. | |
| 8,722,323 B2 | 5/2014 | Wohlstadter et al. | |
| 8,785,881 B2 | 7/2014 | Lozano et al. | |
| 8,791,411 B2 | 7/2014 | Lozano et al. | |
| 8,850,792 B2 * | 10/2014 | Marrese-Reading | B64G 1/405 60/200.1 |
| 9,194,379 B1 | 11/2015 | Biblarz et al. | |
| 9,358,556 B2 | 6/2016 | Velasquez-Garcia et al. | |
| 9,362,097 B2 | 6/2016 | Lozano et al. | |
| 9,460,884 B2 * | 10/2016 | Hopwood | H05H 1/2406 |
| 9,478,403 B2 | 10/2016 | Lozano et al. | |
| 9,669,416 B2 | 6/2017 | Velasquez-Garcia et al. | |
| 9,895,706 B2 | 2/2018 | Velasquez-Garcia et al. | |
| 9,905,392 B2 | 2/2018 | Lozano et al. | |
| 2004/0194305 A1 | 10/2004 | deRochemont et al. | |
| 2005/0131163 A1 * | 6/2005 | Rhine | B01J 13/0091 525/420 |
| 2005/0133372 A1 | 6/2005 | Zhou et al. | |
| 2005/0233085 A1 * | 10/2005 | Miller | B01J 20/28019 427/372.2 |
| 2005/0269559 A1 | 12/2005 | Zhou et al. | |
| 2005/0281379 A1 | 12/2005 | Qiu et al. | |
| 2005/0287421 A1 * | 12/2005 | Simon | H01M 4/583 429/346 |
| 2007/0170056 A1 | 7/2007 | Arnold et al. | |
| 2007/0235647 A1 | 10/2007 | Zona et al. | |
| 2008/0011617 A1 * | 1/2008 | Struthers | B82Y 30/00 |
| 2008/0051881 A1 | 2/2008 | Feng et al. | |
| 2008/0131615 A1 | 6/2008 | Robertson et al. | |
| 2008/0307766 A1 | 12/2008 | Petras et al. | |
| 2009/0032724 A1 | 2/2009 | Lozano et al. | |
| 2009/0072750 A1 | 3/2009 | Akinwande et al. | |
| 2009/0114838 A1 | 5/2009 | Lozano et al. | |
| 2009/0130380 A1 | 5/2009 | Asakawa et al. | |
| 2009/0224679 A1 | 9/2009 | Pan et al. | |
| 2009/0283824 A1 | 11/2009 | Knight et al. | |
| 2009/0309481 A1 | 12/2009 | Chou et al. | |
| 2010/0139823 A1 * | 6/2010 | Gash | C06C 15/00 149/17 |
| 2010/0201251 A1 | 8/2010 | Park et al. | |
| 2010/0209788 A1 | 8/2010 | Yoon et al. | |
| 2010/0284735 A1 | 11/2010 | Sievers et al. | |
| 2010/0289413 A1 | 11/2010 | Eden et al. | |
| 2011/0037102 A1 | 2/2011 | Tchertchian et al. | |
| 2011/0079138 A1 | 4/2011 | Storrie et al. | |
| 2011/0079188 A1 | 4/2011 | Meintschel et al. | |
| 2011/0124116 A1 | 5/2011 | Wohlstadter et al. | |
| 2011/0126929 A1 | 6/2011 | Velasquez-Garcia et al. | |
| 2011/0150765 A1 | 6/2011 | Boyden et al. | |
| 2011/0210265 A1 | 9/2011 | Lozano et al. | |
| 2011/0217544 A1 | 9/2011 | Young et al. | |
| 2011/0284735 A1 | 11/2011 | Van Berkel et al. | |
| 2012/0024421 A1 | 2/2012 | Boutet et al. | |
| 2012/0037595 A1 | 2/2012 | Asakawa et al. | |
| 2012/0045863 A1 | 2/2012 | Hopwood | |
| 2012/0104554 A1 | 5/2012 | Eden et al. | |
| 2012/0119079 A1 | 5/2012 | Ouyang et al. | |
| 2012/0144796 A1 | 6/2012 | Marrese-Reading et al. | |
| 2012/0189836 A1 * | 7/2012 | Kruglick | B01D 57/02 428/292.1 |
| 2012/0244291 A1 | 9/2012 | Bisht et al. | |
| 2012/0301981 A1 | 11/2012 | Ozgur et al. | |
| 2013/0098774 A1 | 4/2013 | Lozano et al. | |
| 2013/0113370 A1 | 5/2013 | Tabib-Azar et al. | |
| 2013/0228700 A1 | 9/2013 | Lozano et al. | |
| 2013/0241115 A1 | 9/2013 | Sharma et al. | |
| 2013/0256535 A1 * | 10/2013 | Meijer | H01J 47/024 250/340 |
| 2013/0319599 A1 | 12/2013 | Huang et al. | |
| 2014/0054809 A1 | 2/2014 | Lozano et al. | |
| 2014/0110661 A1 | 4/2014 | Wang et al. | |
| 2014/0284406 A1 | 9/2014 | Brekenfeld et al. | |
| 2014/0292180 A1 | 10/2014 | Park et al. | |
| 2014/0353397 A1 | 12/2014 | Velásquez-García et al. | |
| 2014/0353860 A1 | 12/2014 | Velásquez-García et al. | |
| 2015/0060757 A1 | 3/2015 | Lee et al. | |
| 2015/0061487 A1 | 3/2015 | Sharifi et al. | |
| 2015/0170865 A1 | 6/2015 | Lozano et al. | |
| 2015/0255241 A1 | 9/2015 | Bonam | |
| 2016/0096185 A1 | 4/2016 | Nobuo et al. | |
| 2016/0107178 A1 | 4/2016 | Velasquez-Garcia et al. | |
| 2016/0111242 A1 | 4/2016 | Lozano et al. | |
| 2016/0297549 A1 | 10/2016 | Lozano et al. | |
| 2016/0318048 A1 | 11/2016 | Velasquez-Garcia et al. | |
| 2017/0110284 A1 | 4/2017 | Lozano et al. | |

FOREIGN PATENT DOCUMENTS

| | | |
|---|---|---|
| WO | WO 2007/002170 A2 | 1/2007 |
| WO | WO 2009/023257 A1 | 2/2009 |
| WO | WO 2009/039338 A1 | 3/2009 |
| WO | WO 2009/137583 A2 | 11/2009 |
| WO | WO 2011/079138 A2 | 6/2011 |
| WO | WO 2012/078043 A1 | 6/2012 |
| WO | WO 2013/003795 A1 | 1/2013 |
| WO | WO 2013/016497 A2 | 1/2013 |

OTHER PUBLICATIONS

International Preliminary Report on Patentability dated Mar. 12, 2015 for Application No. PCT/US2013/057067.

International Preliminary Report on Patentability dated Nov. 18, 2010 for Application No. PCT/US2009/042990.

International Search Report and Written Opinion dated Jun. 17, 2010 for PCT/US2009/042990.

International Search Report and Written Opinion dated Oct. 9, 2014 for PCT/US2014/039851.

International Search Report and Written Opinion dated Mar. 21, 2014 for PCT/US2013/057067.

Bennett, Spinning a yarn, nano-style—more affordable fibres. Materials World Magazine. The Institute of Materials, Minerals and Mining. Jan. 7, 2013. 2 pages. <www.iom3.org/news/spinning-yarn-nano-style-affordable-fibres> Last accessed Jun. 5, 2013.

Burger et al., Nanofibrous materials and their applications. Annu. Rev. Mater. Res., No. 36 pp. 333-368, 2006.

Carretero et al., Numerical Simulation of Taylor Cone-Jets and Colloid Thruster Plumes. 4th International Conference on Spacecraft Proprulsion, Cagliari, Italy. Jun. 2-4, 2004.

Chang et al., Continuous near-field electrospinning for large area deposition of orderly nanofiber patterns. Appl. Phys. Lett. 93:123111 (2008).

(56) References Cited

OTHER PUBLICATIONS

Chiu et al., Mass Spectrometric Analysis of Colloid Thruster Ion Emission from Selected Propellants. Journal of Propulsion and Power. 2005. 21(3):416-23.
Clampitt et al., Intense Field-Emission Ion Source of Liquid Metals. J of Vaccum Science and Technology. 1975. 12 (1):1208.
Cleaver et al. A 100-Kv Ion Probe Microfabrication System with a Tetrode Gun. Vacuum Sci and Technol. 1981. 19(4): 1145-8.
Deitzel et al., Controlled deposition of electrospun poly( ethylene oxide) fibers Polymer No. 42 pp. 8163-8170, 2001.
Despois et al., Permeability of Open Pore Microcellular Materials. Acta Materialia. Elsevier, Oxford, GB. Mar. 2005. 53(5): 1381-8.
Doshi et al., Electrospinning process and applications of electrospun fibers, J Electrost. No. 35, pp. 151-160, 1995.
Driesel et al., In Situ Observation of the Tip Shape of Auge Liquid Alloy Ion Sources Using a High Voltage Transmission Electron Microscope. J. Vac. Sci. Technol. B. 1996. 14(5):3367-80.
Escher et al. Vaccuum Ion Emission From Solid Electrolytes: An Alternative Source for Focused Ion Beams. Applied Physics Letters. 2006. 89: 053513-1 and 053513-2.
Fernandez De La Mora, The Current Emitted by Highly Conductive Taylor Cones, J Fluid Mech. , vol. 260, pp. 155-184, 1994.
Fernandez De La Mora, The Fluid Dynamics of Taylor Cones, Annual Review of Fluid Mechanics, vol. 39: pp. 217-243 (2007).
Gassend et al., A Microfabricated Planar Electrospray Array Ionic Liquid Ion Source with Integrated Extractor, J. of Microelectromechanical Systems, vol. 18, No. 3, pp. 679-694, 2009.
Gassend et al., Precision In-Plane Hand Assembly of Bulk-Microfabricated Components for High Voltage MEMS Arrays Applications, J of Microelectromechanical Systems, vol. 18, No. 2, pp. 332-326 (2009).
Gibson et al., Transport properties of porous membranes based on electrospun fibers, Colloids and Surfaces A: Physicochemical and Engineering Aspects, No. 187-188, pp. 469-481 (2001).
Guharay et al., Characteristics of Focused Beam Spots Using Negative Ion Beams From A Compact Surface Plasma Source and Merits for New Applications. Journal of Vacuum Science and Technology B. 1998. 16(6): 3370-3.
Guzdar et al., Charging of substrates irradiated by particle beams. Applied Physics Letters. 1997. 71(22). 3302-4.
Hardesty, Making 'nanospinning' practical. MIT News Office. Nov. 20, 2012. 3 pages. <web.mit.edu/newsoffice/2012/making-nanospinning-practical-1120.html?tmpl=component&print=1> Last accessed May 31, 2013.
He et al., Magnetic and photomagnetic properties of polycrystalline wide-gap semiconductor $Cd_{1-x}Mn_xTe$ thin films. Journal of Electronic Materials. Feb. 1997. 26(2):73-7.
Hill et al., High-Throughput Ionic Liquid Electrospray Sources Based on Dense Monolithic Arrays of Emitters with Integrated Extractor Grid and Carbon Nanotube Flow Control Structures. Technical Digest of the 17th International Conference on Solid-State Sensors Actuators, and Microsystems. Barcelona, Spain. Jun. 16-20, 2013.
Ishino et al., Wicking within forests of micropillars, Europhysics Letters 79:56005 (2007).
Krpoun et al., Tailoring the hydraulic impedance of out-of-plane micromachined electrospray sources with integratedelectrodes. Appl. Phys. Lett., vol. 94, 2009.
Larriba et al., Monoenergentic Source of Kilodalton Ions from Taylor Cones of Ionic Liquids. Journal of Applied Physics. 2007. 101: 084303-1 to 084303-6.
Larrondo et al., Electrostatic fiber spinning from polymer melts—1. Experimental-observations on fiber formation and properties, J Polym. Sci. B 1No. 9, pp. 909-920 (1981).
Larsen et al., Use of Coaxial Gas Jackets to Stabilize Taylor Cones of Volatile Solutions and to Induce Particle-to-Fiber Transitions, Adv Mater vol. 16, No. 2, 166-169, (2004).
Lee et al., Developing protective textile materials as barriers to liquid penetration using melt electrospinning, Journal of Applied Polymer Science, vol. 102, pp. 3430-3437, (2006).

Legge et al., 18.086 Final Project: Finite Element Modelling of Ionic Liquid Flow Through Porous Electrospray Emitters. May 14, 2008.
Legge et al., Fabrication and Characterization of Porous Metal Emitters for Electrospray Thrusters. IEPC-2007-145 Proc. 30th International Electric Proulsion Conference, Florence, Italy, Sep. 17-20, 2007.
Legge et al., Electrospray propulsion based on emitters microfabricated in porous metals, J. Propul. Power, vol. 27, pp. 485-494, 2011.
Legge, Fabrication and Characterization of Porous Metal Emitters for Electrospray Applications. Brown University (Mechanical Engineering): Department of Aeronautics and Astronautics. May 18, 2008. 140 pages.
Li et al. The Focused-Ion-Beam-Microscope-More than a Precision Ion Milling Machine. JOM. 2006. 58 (3): 27-31.
Li et al., Electrospinning of nanofibers: reinventing the wheel? Advanced Materials, vol. 16, pp. 1151-1170, 2004.
Lozano et al., Electrospray Emission from Nonwetting Flat Dielectric Surfaces. Journal of Colloid and Interface Science. 2004. 276(2): 392-9.
Lozano et al., Energy Properties of an EMI-IM Ionic Liquid Ion Source. J Phys., D: Appl Phys. 2006. 39: 126-34.
Lozano et al., Experimental Measurements of Colloid Thurster plumes in the Ion-Droplet Mixed Regime. (AIAA-3814) 38th Joint Propulsion Conference. Indianapolis, Indiana. Jul. 7-10, 2002. 1-16.
Lozano et al., Ionic liquid ion sources: characterization of externally wetted emitters, J. Colloid Interf. Sci., vol. 282, pp. 415-421, 2005.
Lozano et al., Ionic liquid ion sources: Suppression of Electrochemical Reactions Using Voltage Alternation. J. Colloid Interf. Sci. 2004. vol. 280, pp. 149-154.
Lozano et al., On the Dynamic Response of Externally Wetted Ionic Lisquid Ion Sources. J. Phys. D.: Appl Phys. 2005. 38(14).2371-7.
Lozano et al., Performance Characteristics of Linea Ionic Liquid Electrospray Thruster. IEPC-2005-192. 29th International Electric Propulsion Conference. Princeton University (USA). Oct. 21-Nov. 2005.
Lukas et al., Self-organization of jets in electrospinning from free liquid surface: A generalized approach J. Appl. Phys. 103:084309 (2008).
Mcewen et al., Electrochemical Properties of Imidazolium Salt Electrochemical Capacitor Applications. J. Electrochecm Soc. 1999. 146(5): 1687-95.
Muhle et al., A Time-of-Flight Spectrometer for Investigations on Liquid Metal Ion Sources. J. Phys. D: Appl Physucs, 1999. 32(2): 161-7.
Paruchuri et al., Splitting of a Liquid Jet. Phys. Rev. Lett. vol. 98:134502, 2007.
Petrik et al., Production Nozzle-Less Electrospinning Nanofiber Technology. MRS Proceedings. 1240 1240-WW03-07 doi:10.1557/PROC-1240-WW03-07 (2009). 12 pages.
Podenok et al., Electric Field Enhancement Factors Around a Metallic, End-Capped Cylinder NANO 01 87-93 (2006).
Ponce De Leon et al., Batch-Microfabricated Arrays of Electrospinning Emitters for High Throughput Generation of Nanofibers. Technical Digest of the 12th International Workshop on Micro and Nanotechnology for Power Generation and Energy Conversion Applications. Atlanta GA, USA. pp. 227-230, Dec. 2-5, 2012.
Prewett et al., Focused Ion Beams from Liquid Metal Ion Sources. Research Studies Press. 1991. 19-30, 78-101 and 151-74.
Quéré, Wetting and Roughness. Annu. Rev. Mater. Res. 2008;38:71-99.
Reneker et al., Electrospinning jets and polymer nanofibers, Polymer, vol. 49, pp. 2387-2425, 2008.
Romero-Sanz et al., Source of heavy molecular ions based on Taylor cones of ionic liquids operating in the pure ion evaporation regime, J. Appl. Phys., vol. 94, pp. 3599-3605, 2003.
Scipioni et al., Performance of Multicusp Plasma Ion Sources for Focused Ion Beam Applications. Journal of Vacuum Science and Technology B. 2000. 18(6). 3194-7.
Seiwert et al., Coating of a textured solid. J. Fluid Mech. 669 55 (2011).

(56) References Cited

OTHER PUBLICATIONS

Smith et al. High Brightness Inductively Coupled Plasma Source for High Current Focused Ion Beam Applications. Journal of Vacuum Science and Technology B.2006. 24(6): 2902-6.

Srinivasan et al., Structure and Morphology of small diameter electrospun aramid fibers, Polymer International, No. 36, pp. 195-201, 1995.

Srivastava et al., Multi-jet electrospinning of conducting nanofibers from microfluidic manifolds, J Appl. Polymer Sci. vol. 106 pp. 3171-3178, 2007.

Suzuki et al., Contrast Differenes Between Scanning ION and Scanning Electron Microscope Images. Journal Vacuum Science and Technology A. 2004. 22(1): 49-52.

Swanson et al., Emission Characteristics of Fallium and Bismuth Liquid Metal Ion Sources. J. Vac. Sci. Technol. 1979. 16(6): 1864-9.

Taylor, Disintegration of Water Drops in an Electric Field. Proc. R. Soc. London A 280 (1964) 383-397.

Teo et al., Uniform patterned growth of carbon nanotubes without surface carbon, Appl. Phys. Lett., vol. 79, pp. 1534-1536 (2001).

Thavasi et al., Electrospun Nanofibers in Energy and Environmental Applications. Energy Environ. Sci. 1 205-221. (2008).

Theron et al., Multiple jets in electrospinning: experiment and modeling, Polymer 46 2889-2899 (2005).

Tomaszewski et al., Investigation of electrospinning with the use of a multi-jet electrospinning head, Fibres & Textiles in Eastern Europe, vol. 13, pp. 22-26, 2005.

Tseng et al. Recent Developments In Nanofabrication Using Focused Ion Beams. Small. 2005. 1(10):924-39.

Vaseashta, Controlled formation of multiple Taylor cones in electrospinning process, Applied Physics Letters, vol. 90, No. 9, 093115 (2007).

Velasquez-Garcia et al., A Micro-fabricated Linear Array of Electrospray Emitters for Thruster Applications, J. of Microelectromechanical Systems, vol. 15, No. 5, pp. 1260-1271 (2006).

Velasquez-Garcia et al., A Planar Array of Micro-fabricated Electrospray Emitters for Thruster Applications, J. of Microelectromechanical Systems, vol. 15, No. 5, pp. 1272-1280 (2006).

Velasquez-Garcia et al., An Application of 3D MEMS Packaging: Out-Of-Plane Quadrupole Mass Filters, Journal of Microelectromechanical Systems, vol. 16, No. 6, pp. 1430-1438 (2008).

Velasquez-Garcia et al., CNT-based MEMS Ionizers for Portable Mass Spectrometry Applications, J. of Microelectromechanical Systems, vol. 19,No. 3,pp. 484-493 (2010).

Velasquez-Garcia et al., Precision Hand Assembly of MEMS subsystems using DRIB-patterned deflection Spring Structures: An Example of an Out-of-plane Substrate Assembly, J of Microelectromechanical Systems, vol. 16, No. 3, pp. 598-612, Jun. 2007.

Xiao et al., Prediction and Optimization of Liquid Propagation in Micropillar Arrays, Langmuir 26 15070-15075 (2010).

Yang et al., Multiple Jets in Electrospinning Proceedings of the 8th International conference on properties and applications of dielectric materials, pp. 940-943 (2006).

Yang et al., Research Progress in Preparation and Application of Gradient-Porous Metal. Apr. 2008. Powder Metallurgy Industry. 18(7).

Yarin et al., Upward needleless electrospinning of multiple nanofibers, Polymer, vol. 45, pp. 2977-2980 (2004).

Yoshihiro et al., Characteristics of elastomeric nanofiber membranes produced by electrospinning, Journal of Textile Engineering, vol. 53, No. 4, (2007). 10 pages.

Zeng et al., Influence of Property Gradient on the Behavior of Cellular Materials Subjected to Impact Loading. AIP Conference Proceedings. AIP USA. Feb. 15, 2008. vol. 18.

Zhou et al., Gas flow-assisted alignment of super long electrospun nanofibers, J Nanosci. Nanotechnol. vol. 7, No. 8, pp. 2667-2673 (2007).

Zhou et al., Mass production of nanofiber assemblies by electrospinning, Polym Int, No. 58, pp. 331-342 (2009).

Zong et al., Control of structure, morphology and property in electrospun poly(glycolide-co-lactide) non-woven membranes via postdraw treatments, Polymer, vol. 44 pp. 4959-4967 (2003).

[No Author Cited], SEFAR, Common metal mesh configurations, Dutch Weaves. 2009; 2 pages.

Kobayashi et al., Growth of large-diameter (4nm) single-wall carbon nanotubes in the nanospace of mesoporous material SBA-15. Carbon. 2011;49:5173-9.

Lin et al., Preparation of poly( ether sulfone) nanofibers by gas-jet/electrospinning, J App Polym Sci. Jan. 15, 2008;107(2):909-17. doi: 10.1002/app.26445.

Szilagyi, Electron and Ion Optics, Plenum Press, New York, 1988. 216-50 and 251-63.

Velásquez-García et al., SLA 3-D printed arrays of miniaturized, internally fed, polymer electrospray emitters. J Microelectromech Sys. Dec. 2015;24(6):2117-2127, doi: 10.1109/JMEMS.2015. 2475696.

Velásquez-García et al., Fabrication of large arrays of high-aspect-ratio single-crystal silicon columns with isolated vertically aligned multi-walled carbon nanotube tips. Nanotechnology. Oct. 8, 2008;19(40):405305, 6 pages. doi:10.1088/0957-4484/19/40/405305.

Yamashita et al., Characteristics of elastomeric nanofiber membranes produced by electrospinning. J Textile Eng. Jul. 2007; 53(4):137-42. doi: 10.4188/jte.53.137.

U.S. Appl. No. 15/145,650, filed May 3, 2016, Velasquez-Garcia et al.

U.S. Appl. No. 14/892,847, filed Nov. 20, 2015, Velasquez-Garcia et al.

U.S. Appl. No. 15/272,574, filed Sep. 22, 2016, Lozano et al.

PCT/2014/039851, Dec. 10, 2015, International Preliminary Report on Patentability.

PCT/2015/021277, Nov. 23, 2015, International Search Report and Written Opinion.

PCT/2015/021277, Nov. 10, 2016, International Preliminary Report on Patentability.

International Search Report and Written Opinion dated Sep. 15, 2015 for Application No. PCT/US2015/024827.

International Preliminary Report on Patentability dated Oct. 19, 2017 for Application No. PCT/US2015/024827.

* cited by examiner

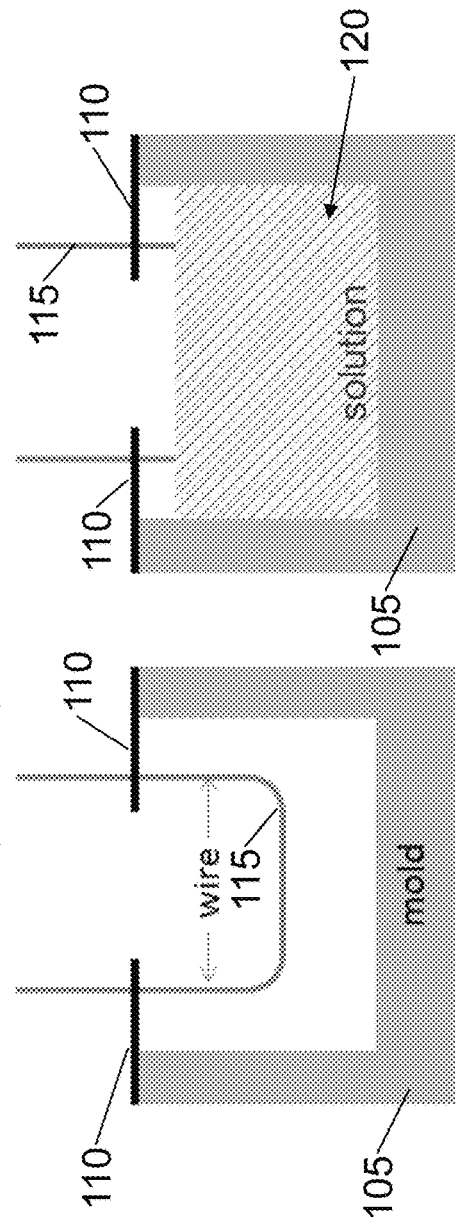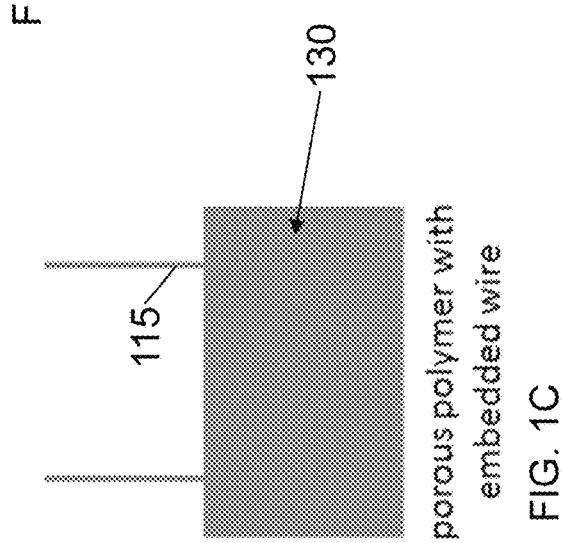

METHOD OF FABRICATING ELECTRICALLY CONDUCTIVE AEROGELS

CROSS-REFERENCE TO RELATED APPLICATION

This application claims the benefit of and priority to U.S. Patent Application No. 61/986,645, filed Apr. 30, 2014, the entire contents of which are incorporated herein by reference in their entirety.

The contents of U.S. patent application Ser. No. 14/070,351, filed on Nov. 1, 2013; U.S. patent application Ser. No. 13/839,064, filed on Mar. 15, 2013; U.S. patent application Ser. No. 13/681,155, filed on Nov. 19, 2012; U.S. patent application Ser. No. 12/990,923, filed on May 3, 2011; PCT application No. PCT/US2009/042990, filed on May 6, 2009; U.S. provisional patent Application No. 61/050,847, filed on May 6, 2008; and U.S. Patent Application No. 61/695,034, filed Aug. 30, 2012 are incorporated herein by reference in their entirety.

GOVERNMENT SUPPORT

This invention was made with Government support under Grant No. FA2386-11-1-4074 awarded by the Asian Office of Aerospace Research and Development. The government has certain rights in the invention.

FIELD OF THE TECHNOLOGY

The present technology relates generally to aerogel and, more specifically, to conductive aerogel.

BACKGROUND

Porous materials can be used in a variety of applications. For example, Ion sources, such as those described in U.S. patent application Ser. No. 13/839,064, can utilize porous materials for various components. For example, in the ion sources described in U.S. patent application Ser. No. 13/839,064, a distal electrode can be made of a porous material.

SUMMARY OF THE TECHNOLOGY

Accordingly, there is a need for electrically conductive porous materials. In one aspect, there is a method of fabricating an electrically conductive aerogel. The method includes providing a solution. The method includes curing the solution to form a polymer. The method includes carbonizing the polymer to form the conductive aerogel. In some embodiments, the method includes forming the solution by combining at least deionized water, formaldehyde, resorcinol, and acetic acid. In some embodiments, the solution is formed by combining, by mass, 34.09 parts deionized water, 40.68 parts formaldehyde, 27.95 parts resorcinol, and 1 part acetic acid. In some embodiments, curing the solution to form the polymer includes curing the solution in a sealed container at approximately 60° C. to 85° C. In some embodiments, carbonizing the polymer to form the conductive aerogel includes pyrolyzing the polymer. In some embodiments, carbonizing the polymer to form the conductive aerogel includes pyrolyzing the polymer in an environment including at least one of carbon dioxide, nitrogen, and argon. In some embodiments, the electrically conductive aerogel has a surface area of at least 400 m$^2$ per gram.

In another aspect, there is a method of fabricating an electrically conductive aerogel. The method includes providing a solution. The method includes inserting a wire into the solution. The method includes curing the solution to form a polymer with the wire embedded in the polymer. The method includes carbonizing the polymer to form the conductive aerogel. In some embodiments, the method includes forming the solution by combining at least deionized water, formaldehyde, resorcinol, and acetic acid. In some embodiments, the solution is formed by combining, by mass, 34.09 parts deionized water, 40.68 parts formaldehyde, 27.95 parts resorcinol, and 1 part acetic acid. In some embodiments, curing the solution to form the polymer includes curing the solution in a sealed container at approximately 60° C. to 85° C. In some embodiments, carbonizing the polymer to form the conductive aerogel includes pyrolyzing the polymer. In some embodiments, carbonizing the polymer to form the conductive aerogel includes pyrolyzing the polymer in an environment including at least one of carbon dioxide, nitrogen, and argon. In some embodiments, the electrically conductive aerogel has a surface area of at least 400 m$^2$ per gram. In some embodiments, the wire comprises stainless steel, nickel chromium, or platinum.

In another aspect, there is a method of fabricating an electrically conductive aerogel. The method includes providing a solution. The method includes providing a mold. The method includes pouring the solution into the mold. The method includes curing the solution in the mold to form a polymer. The method includes carbonizing the polymer to form the electrically conductive aerogel. In some embodiments, the method includes forming the solution by combining at least deionized water, formaldehyde, resorcinol, and acetic acid. In some embodiments, the solution is formed by combining, by mass, 34.09 parts deionized water, 40.68 parts formaldehyde, 27.95 parts resorcinol, and 1 part acetic acid. In some embodiments, curing the solution in the mold to form the polymer includes curing the solution in a sealed container at approximately 60° C. to 85° C. In some embodiments, carbonizing the polymer to form the electrically conductive aerogel includes pyrolyzing the polymer. In some embodiments, carbonizing the polymer to form the electrically conductive aerogel includes pyrolyzing the polymer in an environment including at least one of carbon dioxide, nitrogen, and argon. In some embodiments, the electrically conductive aerogel has a surface area of at least 400 m$^2$ per gram.

In another aspect, there is a method of fabricating an electrically conductive aerogel. The method includes providing a solution. The method includes providing a mold. The method includes suspending a wire in the mold. The method includes pouring the solution into the mold, such that at least a portion of the wire is submerged in the solution. The method includes curing the solution in the mold to form a polymer, wherein the wire is embedded in the polymer. The method includes carbonizing the polymer with the wire embedded to form the electrically conductive aerogel. In some embodiments, the method includes forming the solution by combining at least deionized water, formaldehyde, resorcinol, and acetic acid. In some embodiments, the solution is formed by combining, by mass, 34.09 parts deionized water, 40.68 parts formaldehyde, 27.95 parts resorcinol, and 1 part acetic acid. In some embodiments, curing the solution in the mold to form the polymer includes curing the solution in a sealed container at approximately 60° C. to 85° C. In some embodiments, carbonizing the polymer with the wire embedded to form the electrically conductive aerogel includes pyrolyzing the polymer. In some embodiments, carbonizing the polymer with the wire embedded to form the electrically conductive aerogel includes pyrolyzing the polymer in an environment including at least one of carbon dioxide, nitrogen, and argon. In some embodiments, the electrically conductive aerogel has a surface area of at least 400 m² per gram. In some embodiments, the wire comprises stainless steel, nickel chromium, or platinum.

In another aspect, there is a method of fabricating a porous distal electrode for an electrospray thruster. The method includes providing a solution. The method includes providing a distal electrode mold. The method includes suspending a wire in the distal electrode mold. The method includes pouring the solution into the distal electrode mold, such that at least a portion of the wire is submerged in the solution. The method includes curing the solution in the distal electrode mold to form a polymer, wherein the wire is embedded in the polymer. The method includes carbonizing the polymer with the wire embedded to form the porous distal electrode. In another aspect, there is an electrically conductive aerogel prepared by a process including the steps: providing a solution; curing the solution to form a polymer; and carbonizing the polymer to form the conductive aerogel. In another aspect, there is an electrically conductive aerogel prepared by a process including the steps: providing a solution; inserting a wire into the solution; curing the solution to form a polymer with the wire embedded in the polymer; and carbonizing the polymer to form the conductive aerogel. In another aspect, there is an electrically conductive aerogel prepared by a process including the steps: providing a solution; providing a mold; suspending a wire in the mold; pouring the solution into the mold, such that at least a portion of the wire is submerged in the solution; curing the solution in the mold to form a polymer, wherein the wire is embedded in the polymer; and carbonizing the polymer with the wire embedded to form the electrically conductive aerogel.

In another aspect, there is a porous distal electrode for an electrospray thruster prepared by a process including the steps: providing a solution; providing a distal electrode mold; suspending a wire in the distal electrode mold; pouring the solution into the distal electrode mold, such that at least a portion of the wire is submerged in the solution; curing the solution in the distal electrode mold to form a polymer, wherein the wire is embedded in the polymer; and carbonizing the polymer with the wire embedded to form the porous distal electrode. In another aspect, there is a porous distal electrode for an electrospray thruster. The porous distal electrode includes a body including porous, electrically conductive aerogel. The porous distal electrode includes a wire at least partially embedded in the body.

Other aspects and advantages of the present technology will become apparent from the following detailed description, taken in conjunction with the accompanying drawings, illustrating the principles of the technology by way of example only.

BRIEF DESCRIPTION OF THE DRAWINGS

The foregoing and other objects, features, and advantages of the present technology, as well as the technology itself, will be more fully understood from the following description of various embodiments, when read together with the accompanying drawings, in which:

FIG. 1A-FIG. 1C illustrate an exemplary molding process in accordance with the technology.

DETAILED DESCRIPTION

Figure 2:
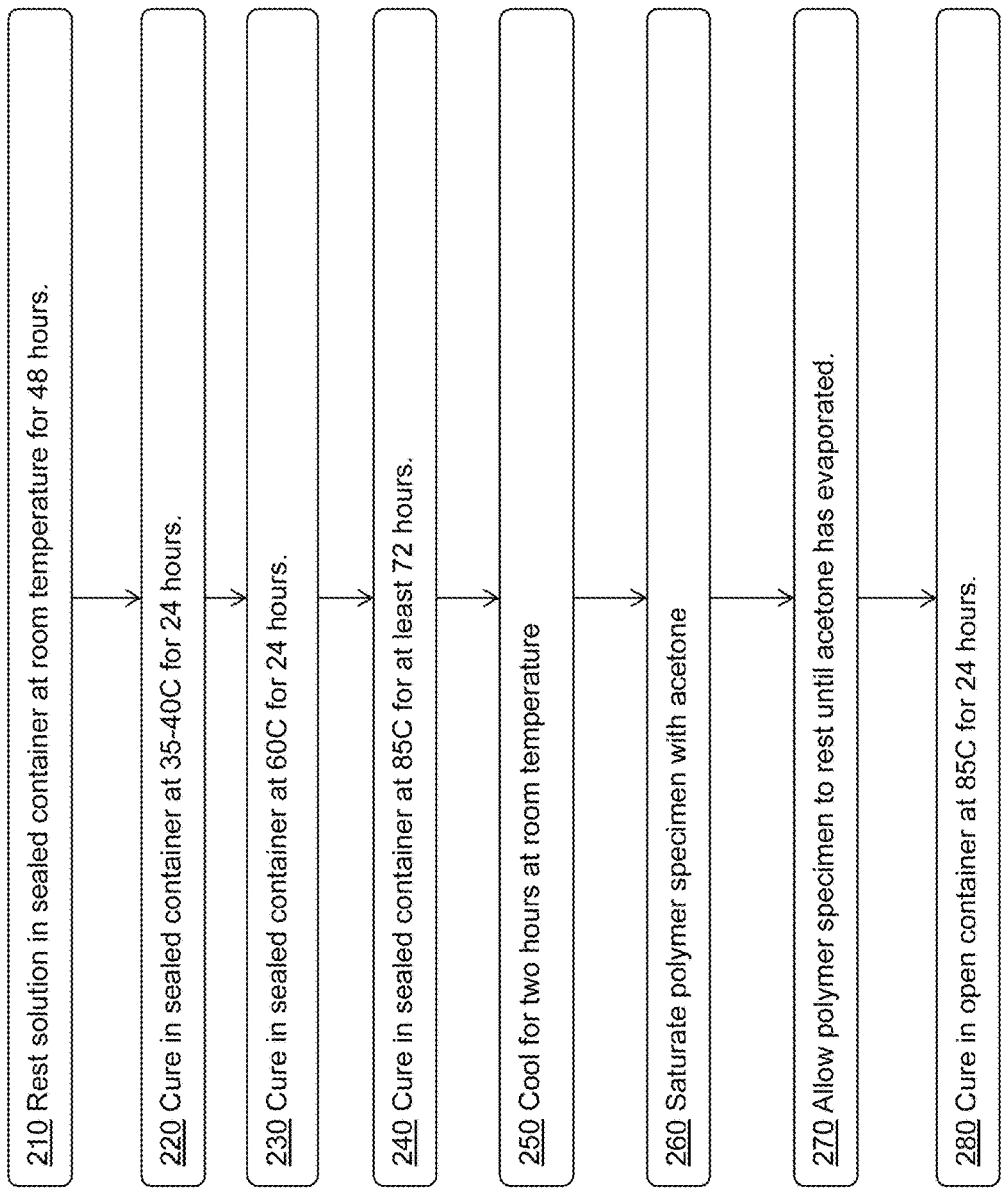
FIG. 2 is a flowchart illustrating a curing process.

The technology disclosed herein relates to electrically conductive aerogel (e.g., acetic acid catalyzed carbon aerogels), and methods of fabricating the aerogel. The technology includes methods to embed wires into the aerogel (e.g., by allowing a gel to form and cure around the wires). The wires can provide electrical and/or mechanical contacts for the aerogel.

Exemplary Fabrication Methods

Fabrication of conductive aerogel can include preparing a solution, molding, embedding a wire, curing, carbonization, and shaping and/or polishing, each of which is described in greater detail below.

Solution Preparation

In some embodiments, conductive aerogel fabrication can include preparing a solution including deionized water, formaldehyde, resorcinol, and acetic acid. For example, the solution can be formed from the following components in the indicated proportions by mass: deionized water (34.09), formaldehyde (40.68), resorcinol (27.95), and acetic acid (1). The resorcinol can be added to the deionized water and mixed until fully dissolved. The formaldehyde can be added to the solution, and the solution can be mixed (e.g., the solution can be thoroughly mixed for approximately a minute). The acetic acid can be added to the solution, and the solution can be mixed (e.g., the solution can be thoroughly mixed for approximately a minute). In some applications, prior to gelation and hardening, the solution can be poured into molds.

Molding and Embedding Wire

The solution described above can be placed in molds to form aerogel specimens, as appropriate for the intended application. A wire can be inserted into the solution. FIG. 1A-FIG. 1C illustrate an exemplary molding process in accordance with the technology. A cross-section of an exemplary mold 105 is illustrated. Mold 105 can be any mold made in the desired shape for the aerogel specimen. In some embodiments, an oversized mold can be used to account for shrinkage that occurs during the curing process. Mold 105 can be made of any suitable material for withstanding the curing process described below. In some embodiments, mold 105 can be made from polypropylene or RTV silicone. In some embodiments, mold 105 can include mounts 110. Mounts 110 can be used to mount wire 115, such that wire 115 can be suspended in mold 105. Wire 115 can be made of any suitable material for withstanding the curing process described below. In some embodiments, wire 115 can be made from stainless steel, nickel chromium, and/or platinum.

As illustrated in FIG. 1B, solution 120 can be poured into mold 105. Solution 120 can be a solution of deionized water, formaldehyde, resorcinol, and acetic acid, as described above. Wire 115 can be placed in mold 105 such that wire 115 is at least partially submerged in solution 120. Preferably, wire 115 can be inserted into solution 120 before solution 120 gels.

Curing

Conductive aerogel fabrication can include curing the solution described above (e.g., the solution can be cured in molds). In some instances, curing can take approximately one week. Airtight or sealed containers (e.g., commercially available SNAPWARE containers) can be used during the curing process. For example, with reference to FIG. 1B, solution 120 in mold 105 containing can be cured to harden solution 120 with wire 115 in place as described below.

FIG. 2 is a flowchart illustrating a curing process. In accordance with embodiments of the technology, the solution (e.g., while in molds) can be placed in an airtight container at room temperature conditions (e.g., approximately 72° F.) and allowed to rest for 48 hours (step 210). During this period, the solution can turn from a clear liquid to an opaque white liquid. The solution can slowly become more viscous until it appears to be a solid gel. The opaque white gel can then start turning a light orange color.

The airtight container containing the gel can then be placed in an oven and cured at approximately 35-40° C. for approximately 24 hours (step 220). During this curing step, the gel can begin turning a darker orange/red color. The oven temperature can then be increased to approximately 60° C., and the gel can cure at approximately 60° C. for approximately 24 hours (step 230). During this curing step, the gel can continue to get darker orange and/or red. The oven temperature can then be increased to approximately 85° C., and the gel can cure at approximately 85° C. for at least approximately 72 hours (step 240). During this curing step, the gel can continue to get darker orange and/or red.

The container containing the gel can be removed from the oven and allowed to cool for approximately two hours at approximately room temperature (step 250). The gel can be saturated with acetone (step 260), and allowed to rest until all of the acetone has evaporated (step 270). To complete the curing process, the open container containing the gel can be placed in an oven and cured at approximately 85° C. for at least approximately 24 hours (step 280). The above described curing process can produce a red, porous polymer. The polymer can be removed from the mold at the conclusion of curing (e.g., as illustrated by porous polymer 130 of FIG. 1C).

Carbonization

Figure 3:
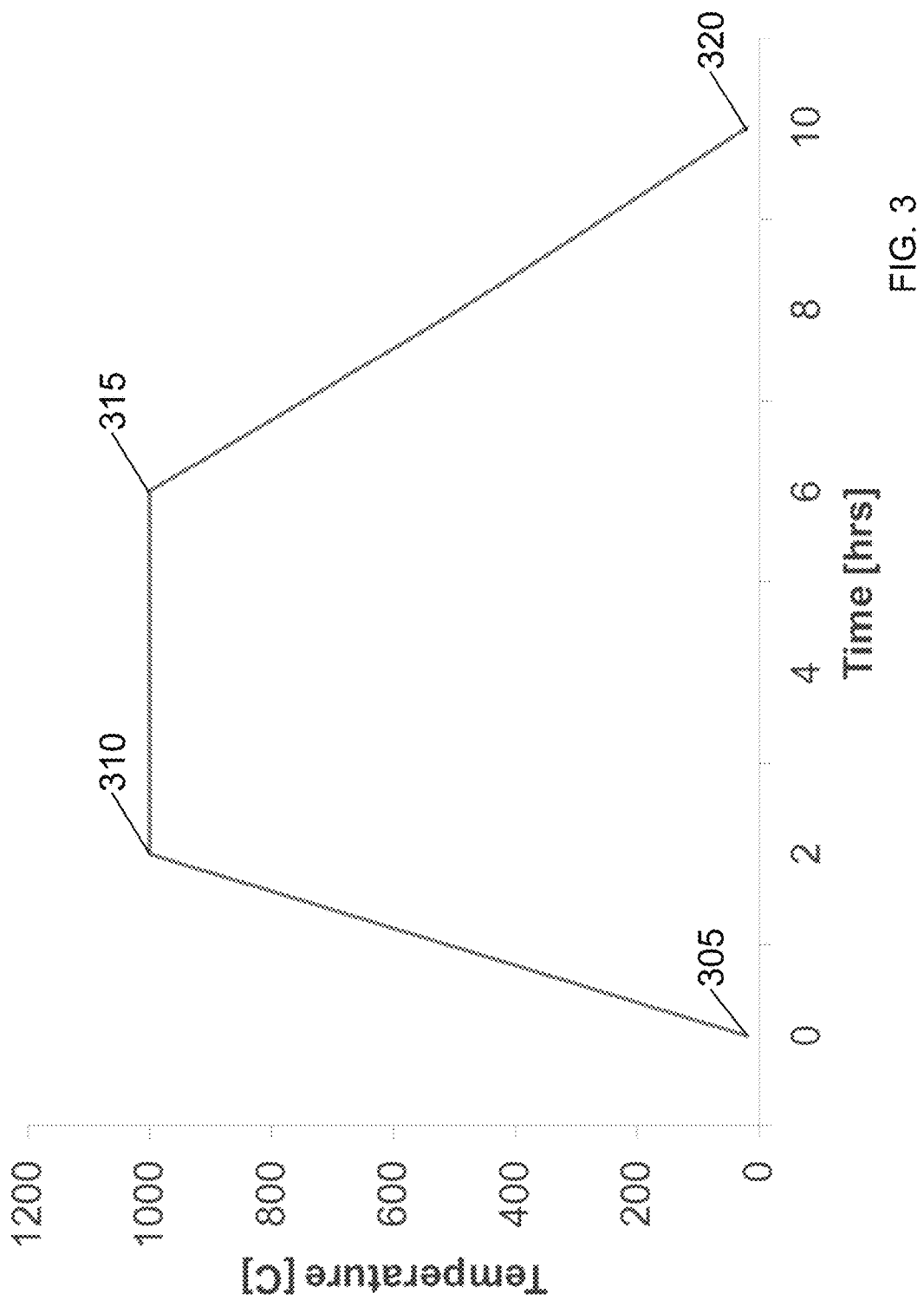
FIG. 3 is a graph illustrating the temperature of a tube furnace during carbonization.

The polymer produced by the curing process described is non-conductive. In some embodiments of the technology, a carbonization step can be used to turn the polymer into a porous and conductive carbon material. In some embodiments, the polymer can be carbonized in the mold used during the curing process. In some embodiments, the polymer can be removed from the mold used during the curing process prior to carbonization. For example, the polymer can be carbonized by a pyrolyzation process. The polymer can be carbonized by placing it in a tube furnace at high temperature. In some embodiments, the tube furnace has a steady flow of inert gas (e.g., nitrogen or argon) at approximately 500 standard cubic centimeters per minute (sccm). In some embodiments, the temperature of the tube furnace containing the polymer can be slowly increased and decreased during the carbonization process. FIG. 3 is a graph illustrating the temperature of a tube furnace during carbonization. From time 305 to 310 (e.g., approximately 2 hours), the temperature of the tube furnace containing the polymer is increased to approximately 1000° C. From time 310 to 315 (e.g., approximately 4 hours), the temperature of the tube furnace containing the polymer is maintained at approximately 1000° C. From time 315 to 320 (e.g., approximately 4 hours), the temperature of the tube furnace containing the polymer is decreased to approximately 20° C. The above described curing carbonization process can produce an electrically conductive, porous carbon aerogel.

In some embodiments, carbon dioxide can be flowed over the specimen as it is heated in a tube furnace. Such a process can increase internal surface area of the aerogel by approximately an order of magnitude.

Polishing and/or Shaping

Aerogel fabrication can include polishing and/or shaping the aerogel, as appropriate for the desired application. The molding process described above allows for a slightly oversized aerogel specimen, which permits it to be polished to the desired shape. Polishing can be done, for example, with high-grit sandpaper.

Exemplary Applications

The aerogel described herein can be incorporated into a variety of applications, such as in electrospray thrusters, electrospray emitters, and batteries. Beneficially, the aerogel can provide a large internal surface area (e.g., approximately 400 $m^2$ or more per gram of the aerogel) with low density (e.g., approximately 0.5 g/cc). As described above, the fabrication methods can facilitate molding the aerogel into a variety of shapes, and the embedded wire can provide a mechanical and/or electric contact.

Figure 4:
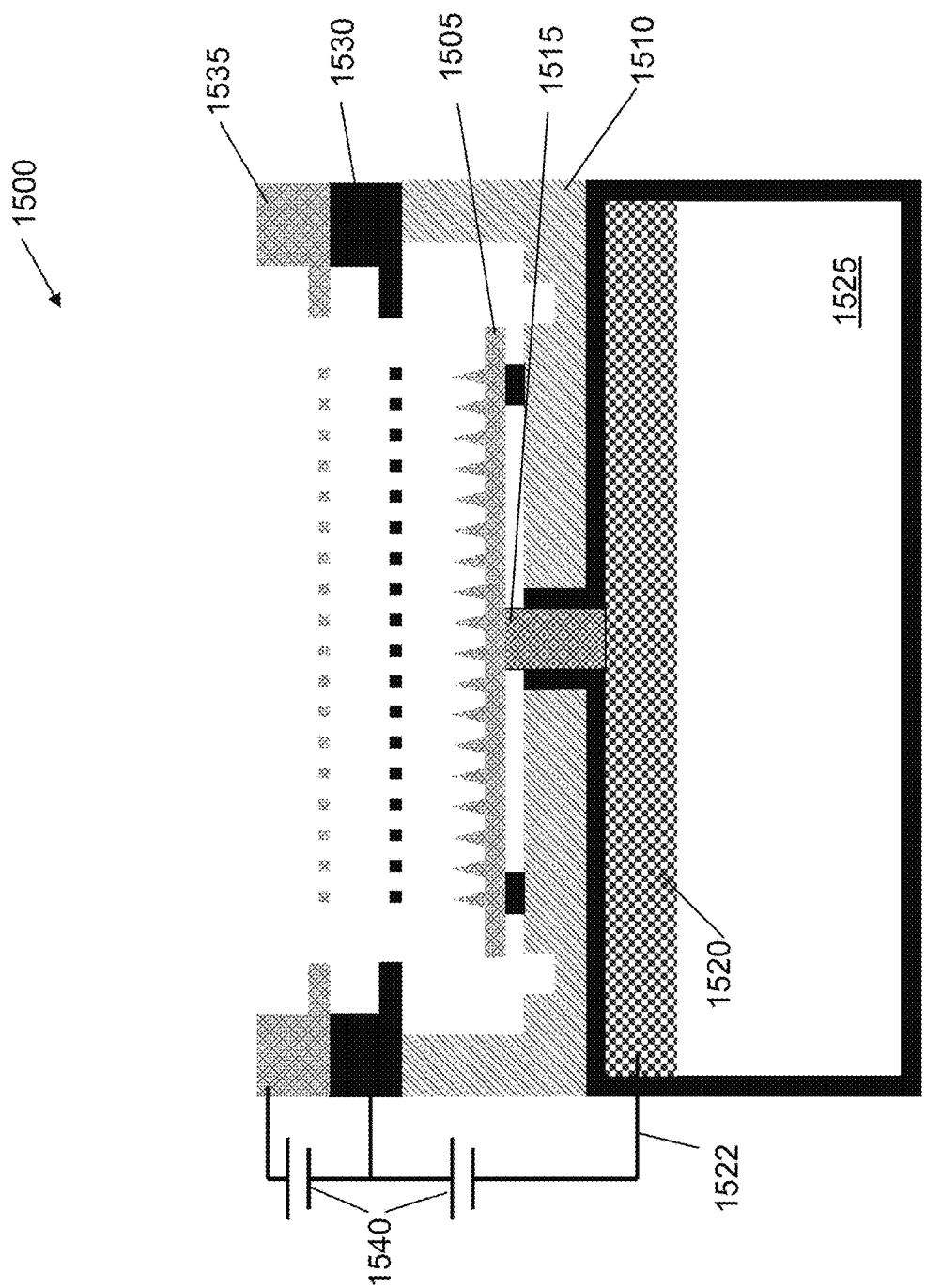
FIG. 4 is a schematic of an electrospray ion source.

In an exemplary application, carbon aerogel can be used as a distal electrode in an electrospray thruster. Electrospray thrusters utilizing distal electrodes are described in greater detail in U.S. application Ser. No. 13/839,064, filed on Mar. 15, 2013, the contents of which are hereby incorporated by reference. FIG. 4 is a schematic of an electrospray ion source 1500. Ion source 1500 includes emitter array 1505. Emitter array 1505 is housed in thruster package 1510 (made from e.g., silicon). Emitter array 1505 is disposed against porous plug/isolation valve 1515. Porous plug/isolation valve 1515 is disposed against distal electrode 1520. Distal electrode 1520 can be made from carbon aerogel with embedded wire 1522 providing an electrical contact. Porous plug/isolation valve 1515 can serve as a connecting member between emitter array 1505 and distal electrode 1520. Distal electrode 1520 is in contact with ionic liquid 1525. In some embodiments, each of emitter array 1505, porous plug/isolation valve 1515, and distal electrode 1520 can include a pore size gradient that decreases from its base to its top (e.g., in the direction toward the tips of needle emitter array 1505), such that ionic liquid can be transported through capillarity. In some embodiments, emitter array 1505 can have smaller-sized pores than porous plug/isolation valve 1515, which in turn can have smaller-sized pores than distal electrode 1520, creating a pore size gradient that decreases from distal electrode 1520 to emitter array 1505, such that ionic liquid 1525 can be transported through capillarity from distal electrode 1520 to emitter array 1505.

Figure 5:
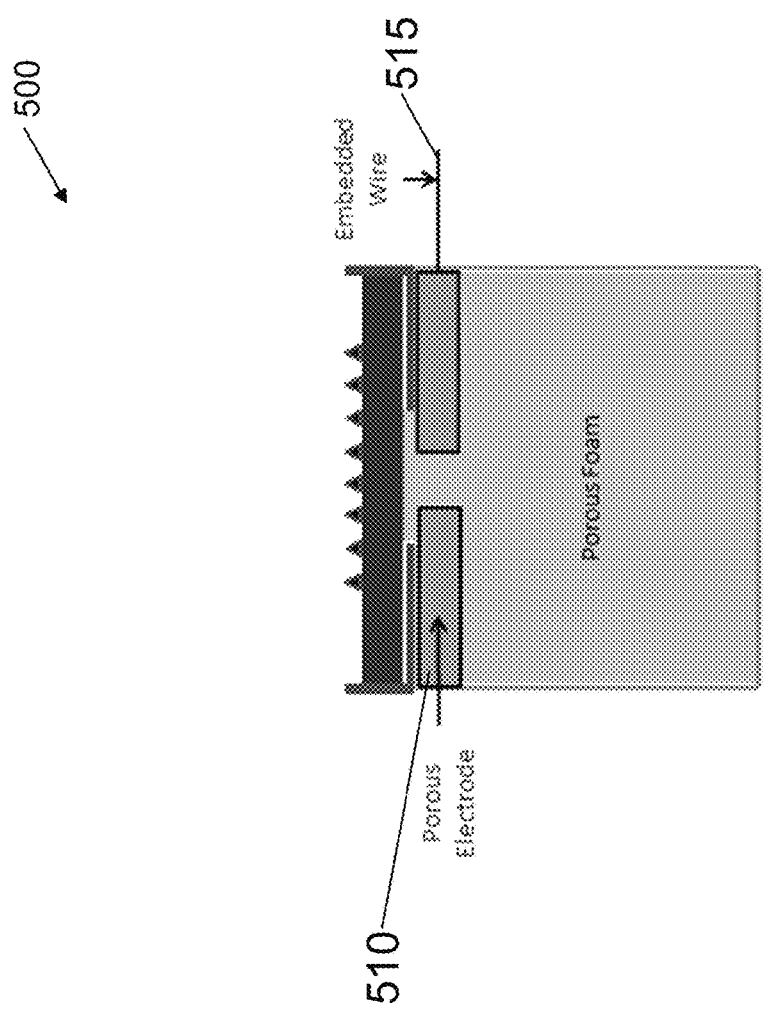
FIG. 5 is a schematic of a thruster.
Figure 6:
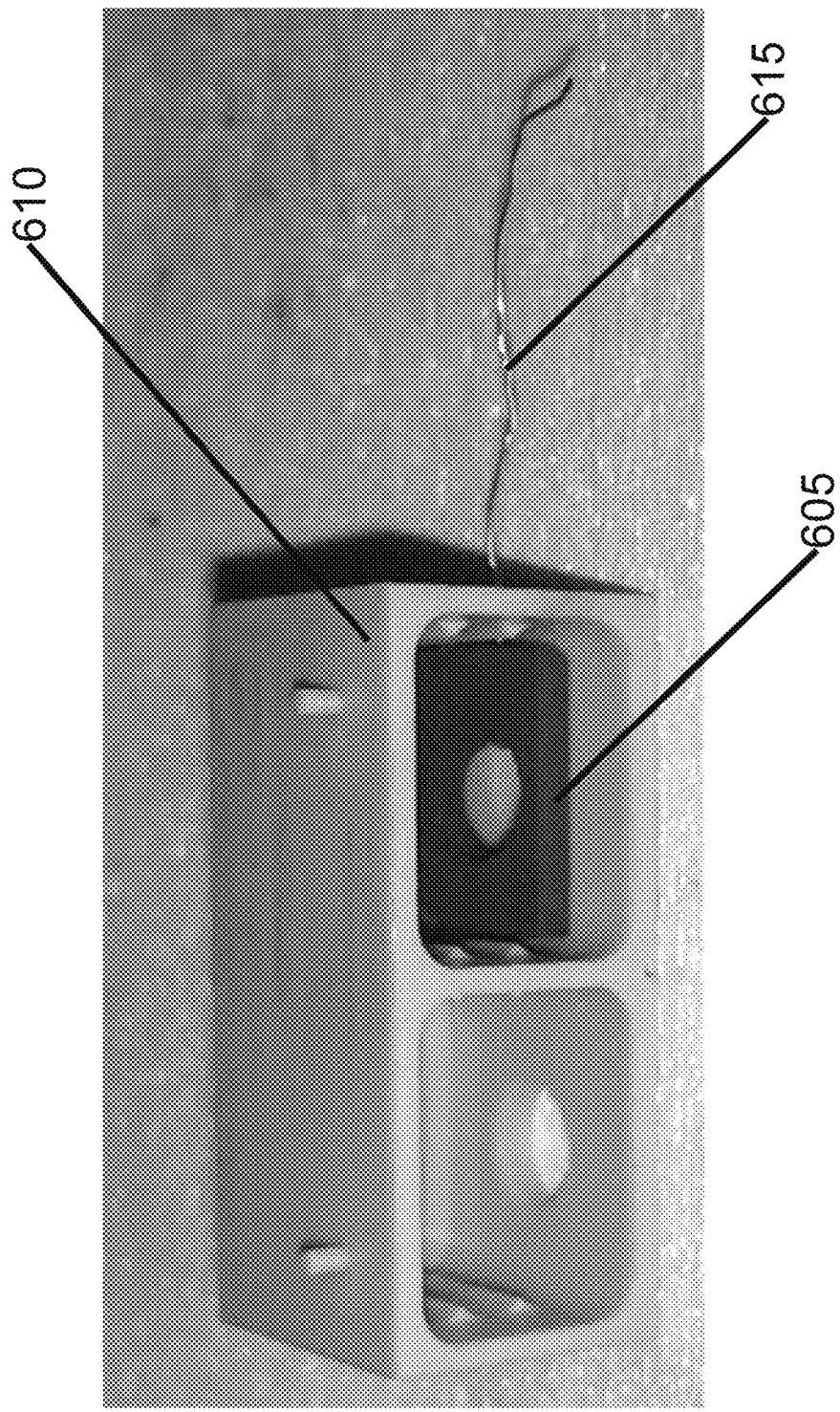
FIG. 6 illustrates a distal electrode placed in a thruster tank.

Extractor electrode 1530 can be positioned downstream relative to emitter array 1505. Accelerator grid 1535 can be position downstream relative to extractor grid 1530. Bipolar power source 1545 can apply a voltage to distal electrode 1520 relative to extractor electrode 1530, thereby emitting a current (e.g., a beam of ions) from the tips of emitter array 1505. The application of a voltage can cause the emission of ions from emitter array 1505. FIG. 5 is a schematic of thruster 500. Similar to that described with respect to FIG. 4, thruster 500 includes distal electrode 510 including embedded wire 515. Distal electrode 510 can be made from carbon aerogel as described above. FIG. 6 illustrates distal electrode 605 placed in thruster tank 610. In the illustrated embodiment, distal electrode 605 is formed from carbon aerogel. After electrode 605 is shaped into the correct geometry, wire 615 is inserted into a small hole in the side of tank 610 and electrode 605 follows until it is all the way in tank 610. In some embodiments, electrode 605 can be flush with the top face (same face where the thruster package attaches) of tank 610.

Beneficially, a distal electrode made from carbon aerogel provides a large contact area with the ionic liquid propellant. The large surface area can act like a capacitor capable of accumulating charge at the interface between the distal electrode material and the ionic liquid (e.g., which permeates into the pores of the distal electrode). The dispersed charge can facilitate keeping the level of local charge lower (e.g., while charge across the aerogel is large, it is spread out across a large surface area, and locally the charge is relatively small) such that the electric field at the distal electrode/ionic liquid interface is not strong enough to trigger electrochemical reactions. In some applications, before charge sufficient to cause electrochemical reactions is accumulated on the surface of the electrode, the polarity of the thruster is reversed, to deplete the charge and start a new charging cycle in the opposite polarity.

Beneficially, if some electrochemistry were to occur at the distal electrode, its effects can be confined to the electrode, which can have a large enough area to survive while leaving the emitter substrate material untouched by the electrochemical reactions, thus increasing the lifetime of the emitter substrate that produces the ion beams.

Experimental Results

Figure 7:
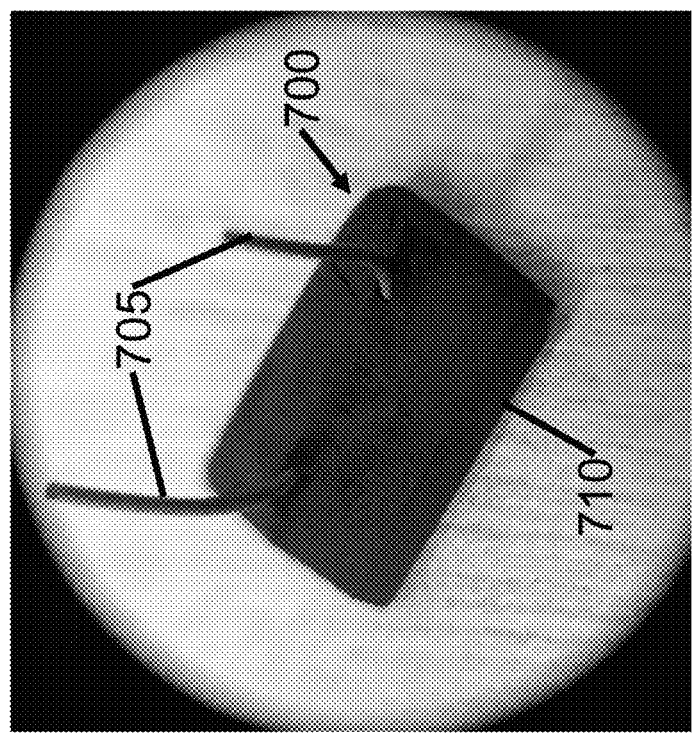
FIG. 7 illustrates an electrode, including a wire embedded in carbon aerogel.

FIG. 7 illustrates electrode 700, including wire 705 embedded in carbon aerogel 710. In the illustrated embodiment, the fabrication process described above was used. Wire 705 is made from stainless steel. It was found that stainless steel was able to tolerate the high temperatures in the fabrication process. The approximate dimensions of electrode 700 are 10 mm×6 mm×2 mm in thickness. It was determined that the stainless steel wires were stiff and brittle after the high temperature carbonization step.

Figure 8:
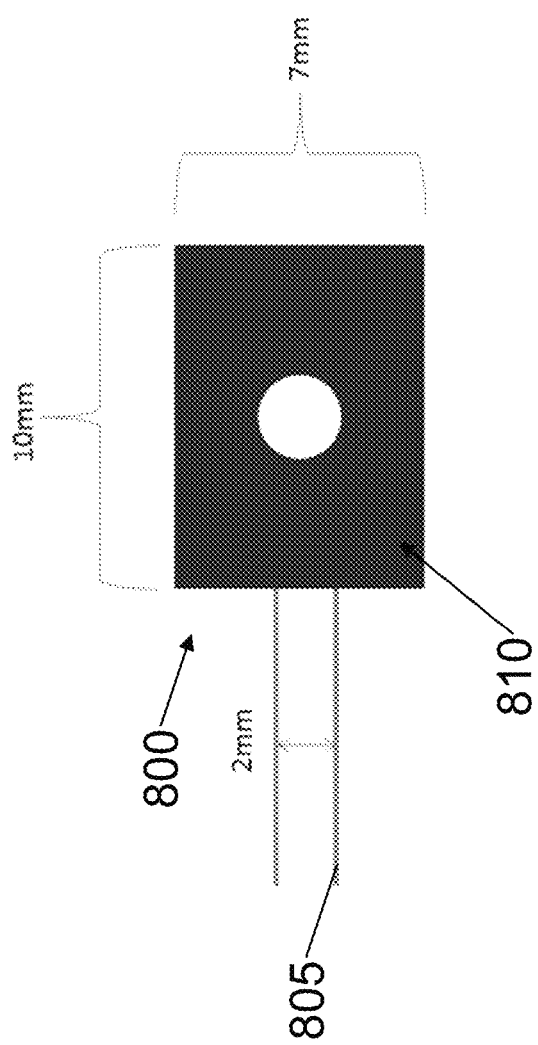
FIG. 8 illustrates an electrode, including a wire embedded in carbon aerogel.
Figure 9:
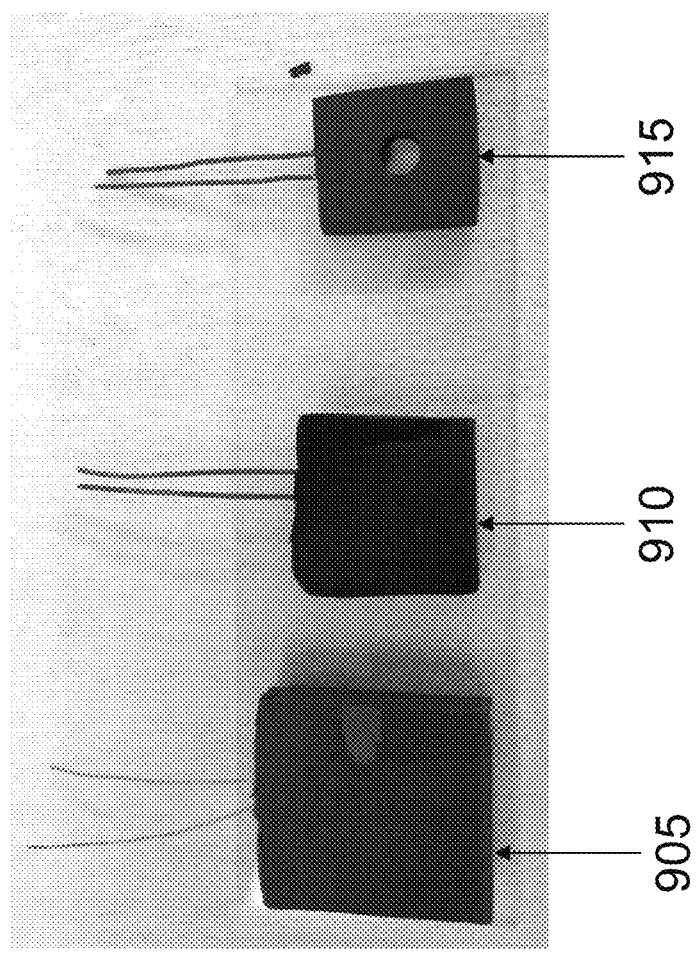
FIG. 9 illustrates an electrode after curing, an electrode after carbonization, and a final product electrode.

FIG. 8 illustrates electrode 800, including wire 805 embedded in carbon aerogel 810. In the illustrated embodiment, wire 805 is made from Nickel Chromium (Nichrome). Nichrome can be less brittle at the high temperatures and can have more soldering options than stainless steel. Electrode 800 has approximate dimensions 7 mm by 10 mm by 2 mm in thickness. In the illustrated embodiment, the dimensions of electrode 800 are selected to facilitate incorporating electrode 800 into a thruster tank, e.g., as illustrated above. FIG. 9 illustrates an electrode after curing (905), an electrode after carbonization (910), and a final product electrode (915).

Figure 10:
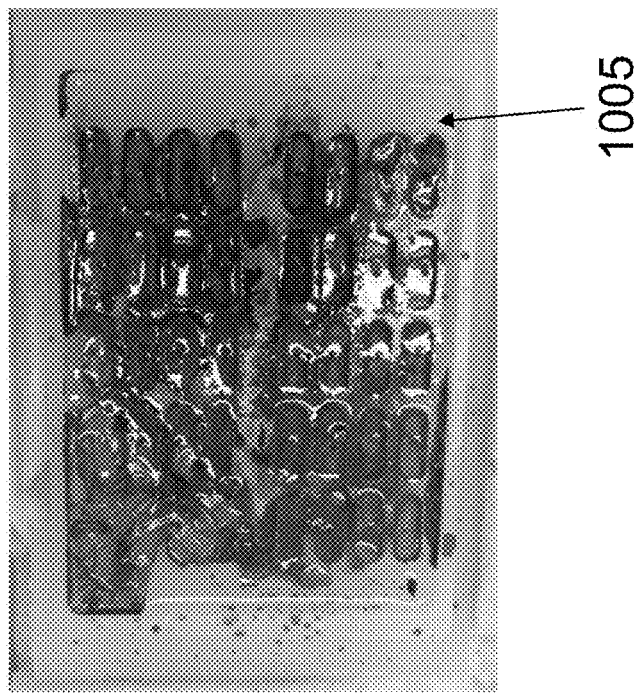
FIG. 10 depicts a mold for forming electrodes.
Figure 11:
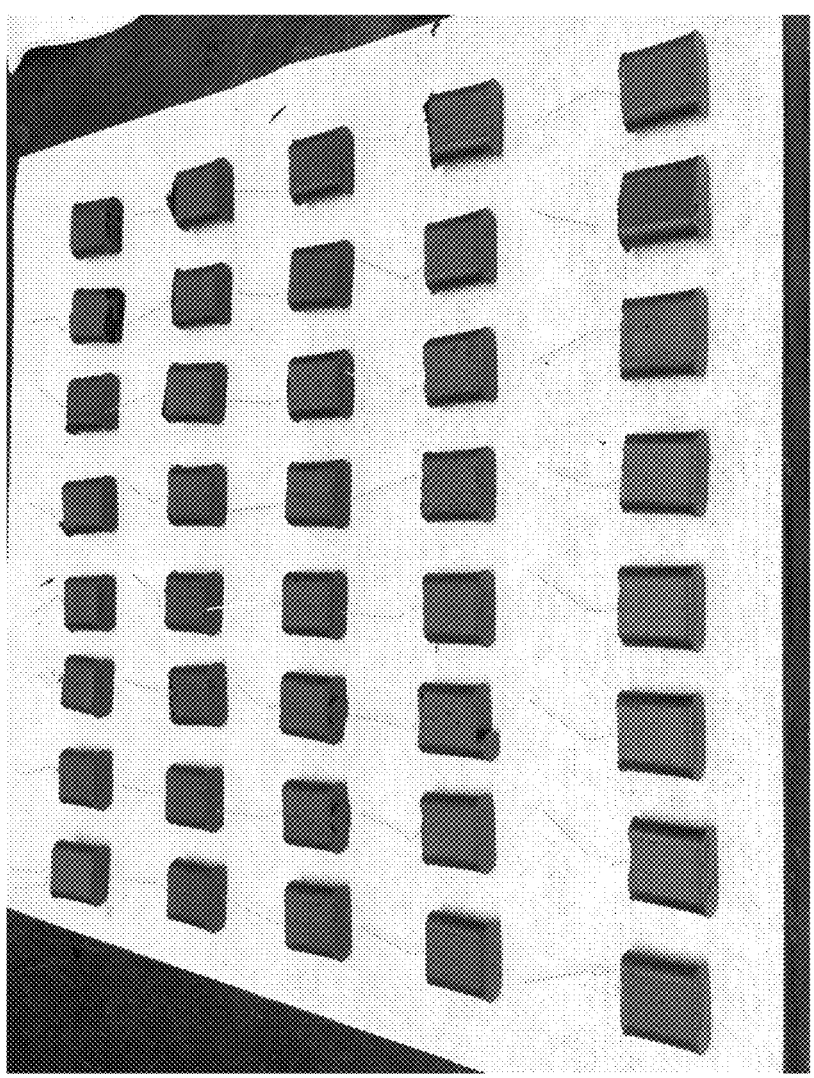
FIG. 11 depicts pre-carbonization, post-cure electrodes out of mold.

FIG. 10 depicts mold 1005 for forming electrodes. Mold 1005 is a custom machined mold that allows for the production of 40 electrodes at a time. For example, mold 1005 can produce electrodes of approximate dimensions of electrode 600 are 10 mm×6 mm×2 mm thick. FIG. 11 depicts pre-carbonization, post-cure electrodes out of mold 1005.

The technology has been described in terms of particular embodiments. The alternatives described herein are examples for illustration only and not to limit the alternatives in any way. The steps of the technology can be performed in a different order and still achieve desirable results. Other embodiments are within the scope of the following claims.

What is claimed is:

1. A method of fabricating an electrospray thruster component with an electrically conductive aerogel comprising:
   curing a solution in a mold of the electrospray thruster component to form a polymer precursor of the electrospray thruster component, wherein the electrospray thruster component is a distal electrode of an electrospray thruster; and
   carbonizing the polymer precursor to form the conductive aerogel, wherein the component includes a pore size gradient across the component.

2. The method of claim 1, further comprising pouring the solution into the mold.

3. The method of claim 1, further comprising submerging at least a portion of a wire in the solution.

4. The method of claim 3, wherein submerging the wire in the solution comprises inserting the wire into the solution.

5. The method of claim 3, wherein submerging the wire in the solution includes suspending the wire in the mold of the electrospray thruster component with at least a portion of the wire submerged in the solution.

6. The method of claim 5, wherein suspending the wire in the mold includes suspending the wire in the mold with a mount associated with the mold.

7. The method of claim 3, wherein curing the solution includes curing the solution to form the polymer with the wire embedded in the polymer.

8. The method of claim 3, further comprising carbonizing the polymer with the wire embedded in the polymer to form the electrospray thruster component.

9. The method of claim 3, wherein the wire comprises stainless steel, nickel, chromium, or platinum.

10. The method of claim 3, wherein the wire forms an electrical contact of the electrospray thruster component.

11. The method of claim 1, further comprising forming the solution by combining at least deionized water, formaldehyde, resorcinol, and acetic acid.

12. The method of claim 1, wherein carbonizing the polymer to form the conductive aerogel comprises pyrolyzing the polymer.

13. The method of claim 1, wherein carbonizing the polymer to form the conductive aerogel comprises pyrolyzing the polymer in an environment comprising at least one of carbon dioxide, nitrogen, and argon.

14. The method of claim 1, wherein a surface area of the electrically conductive aerogel is at least 400 $m^2$ per gram.

15. A method of fabricating an electrospray thruster component with an electrically conductive aerogel comprising:
   curing a solution to form a polymer precursor of the electrospray thruster component; allowing the polymer precursor to rest until a solvent in the precursor has evaporated; and
   carbonizing the polymer precursor to form the conductive aerogel, wherein the component includes a pore size gradient across the component.

16. The method of claim 15, comprising curing the solution in a mold to form the polymer precursor.

17. The method of claim 15, comprising curing the solution in a sealed container.

18. The method of claim 17, comprising curing the solution in the sealed container at between or equal to 60 degrees Celsius and 85 degrees Celsius.

19. A method of fabricating an electrospray thruster component with an electrically conductive aerogel comprising:

curing a solution to form a polymer precursor of the electrospray thruster component;

submerging at least a portion of a wire in the solution, wherein the wire includes one or more bends along a portion of the wire embedded in the polymer; and carbonizing the polymer precursor to form the conductive aerogel.

20. The method of claim 19, wherein the component includes a pore size gradient across the component.

21. The method of claim 19, wherein the electrospray thruster component is a distal electrode of the electrospray thruster.

22. The method of claim 19, further comprising carbonizing the polymer with the wire embedded in the polymer to form the electrospray thruster component.

23. The method of claim 19, wherein the wire comprises stainless steel, nickel, chromium, or platinum.

* * * * *